(12) United States Patent
Minami et al.

(10) Patent No.: US 9,711,936 B2
(45) Date of Patent: Jul. 18, 2017

(54) SEMICONDUCTOR LASER AND METHOD FOR MANUFACTURING THE SAME

(71) Applicant: Mitsubishi Electric Corporation, Tokyo (JP)

(72) Inventors: Masafumi Minami, Tokyo (JP); Naohisa Tamada, Tokyo (JP); Takahiro Ueno, Tokyo (JP); Motoshi Kitagawa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/218,394

(22) Filed: Jul. 25, 2016

(65) Prior Publication Data

US 2017/0133820 A1 May 11, 2017

(30) Foreign Application Priority Data

Nov. 9, 2015 (JP) ................. 2015-219162

(51) Int. Cl.
*H01S 5/02* (2006.01)
*H01S 5/00* (2006.01)

(52) U.S. Cl.
CPC .............. *H01S 5/0207* (2013.01); *H01S 5/00* (2013.01); *H01S 5/0206* (2013.01); *H01S 5/0208* (2013.01)

(58) Field of Classification Search
CPC ......... H01S 5/0207; H01S 5/00; H01S 5/0206
See application file for complete search history.

(56) References Cited

U.S. PATENT DOCUMENTS

| 4,434,491 A * | 2/1984 | Sakuma ................ H01S 5/2232 372/46.012 |
| 2003/0094667 A1* | 5/2003 | Mogi ................... G02B 6/4224 257/466 |
| 2010/0111129 A1 | 5/2010 | Nakashima et al. |

FOREIGN PATENT DOCUMENTS

| JP | 2010-135731 A | 6/2010 |
| JP | 2012-222029 A | 11/2012 |

* cited by examiner

*Primary Examiner* — Dung Nguyen
(74) *Attorney, Agent, or Firm* — Studebaker & Brackett PC

(57) ABSTRACT

A method for manufacturing a semiconductor laser of the present invention includes a step of forming an insulating film on a surface of a grooved semiconductor substrate, a step of pasting an insulating sheet to a top surface of the insulating film so as to cover an opening of the groove and forming an insulating layer on the semiconductor substrate, a step of forming an opening of providing a first opening in the insulating layer so that a part corresponding to an electrode of the semiconductor substrate is exposed and a step of forming the electrode on a top surface of the insulating layer so as to fill the first opening.

13 Claims, 5 Drawing Sheets step31 step32

SEMICONDUCTOR LASER AND METHOD FOR MANUFACTURING THE SAME

BACKGROUND OF THE INVENTION

Field

The present invention relates to a semiconductor laser and a method for manufacturing the same, and relates to a semiconductor laser and a method for manufacturing the same suitable for use in a communication laser.

Background

JP 2010-135731 A discloses a semiconductor laser provided with a grooved semiconductor substrate and a method for manufacturing the same. In this semiconductor laser, wiring is performed with an electrode spanning above the groove. Before forming the electrode, the groove is filled with a resist first. Next, the electrode is formed on the top surface of the resist. After that, the resist is removed.

The manufacturing method disclosed in JP 2010-135731 A once fills the groove with the resist to perform wiring of the electrode above the groove. This complicates the manufacturing process.

SUMMARY

The present invention has been implemented to solve the above-described problem and it is a first object of the present invention to provide a manufacturing method with a simplified manufacturing process for a semiconductor laser provided with a grooved structure.

It is a second object of the present invention to provide a semiconductor laser having a structure capable of simplifying a manufacturing process.

The features and advantages of the present invention may be summarized as follows.

According to the present invention, a method for manufacturing a semiconductor laser includes a step of forming an insulating film on a surface of a grooved semiconductor substrate, a step of pasting an insulating sheet to a top surface of the insulating film so as to cover at least part of an opening of the groove and forming an insulating layer on the semiconductor substrate, an step of forming an opening of providing a first opening in the insulating layer so that a part corresponding to an electrode of the semiconductor substrate is exposed and a step of forming the electrode on a top surface of the insulating layer so as to fill the first opening.

According to the present invention, a semiconductor laser includes a grooved semiconductor substrate, an insulating layer formed on the semiconductor substrate, a first opening provided in the insulating layer so that a part corresponding to the electrode of the semiconductor substrate is exposed and an electrode formed on a top surface of the insulating layer so as to fill the first opening, and the insulating layer includes an insulating film formed on a surface of the semiconductor substrate, an insulating sheet provided on the insulating film so as to cover at least part of an opening of the groove and a hollow part surrounded by the groove and the insulating sheet.

Other and further objects, features and advantages of the invention will appear more fully from the following description.

DESCRIPTION OF EMBODIMENTS

Figure 1:
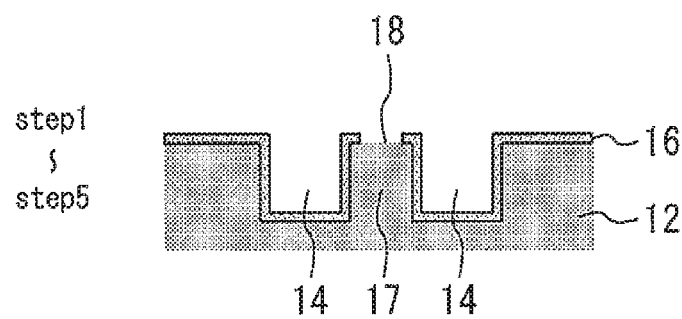
FIG. 1 is a cross-sectional view illustrating an insulating film provided on a top surface of a semiconductor substrate according to a first embodiment of the present invention.

A semiconductor laser 10 and a method for manufacturing the same according to embodiments of the present invention will be described with reference to the accompanying drawings. The same or corresponding components will be assigned the same reference numerals and duplicate description may be omitted.

First Embodiment

FIG. 1 to FIG. 6 are cross-sectional views illustrating a method for manufacturing the semiconductor laser 10 according to a first embodiment. In FIG. 1, a semiconductor substrate 12 is provided with grooves 14 and a mesa part 17 sandwiched between the grooves 14 on both sides. The semiconductor substrate 12 is also provided with a part corresponding to an electrode 18 on a top surface of the mesa part 17.

The structure shown in FIG. 1 can be formed in the following steps. First, an insulating film 16 is formed on a surface of the semiconductor substrate 12 (step 1). Next, an opening is provided in the insulating film 16 using the following procedure. First, a resist is applied to a top surface of the insulating film 16 (step 2). Next, the resist is patterned by lithography (step 3). Next, the insulating film 16 is etched using the patterned resist as an etching mask (step 4). Next, the resist is removed (step 5). As a result, an opening is provided in the insulating film 16 as shown in FIG. 1 and the part corresponding to an electrode 18 is exposed.

Figure 2:
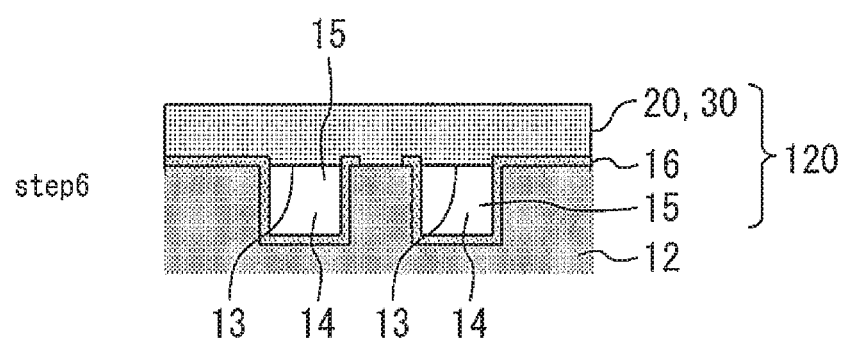
FIG. 2 is a cross-sectional view illustrating an insulating sheet pasted onto FIG. 1 according to the first embodiment of the present invention.

Next, as shown in FIG. 2, an insulating sheet 20 is pasted to the top surface of the insulating film 16 (step 6). The insulating sheet 20 is pasted so as to cover part of the opening 13 of the groove 14. Thus, a hollow part 15 is formed between the groove 14 and the insulating sheet 20 in this way. As a result, an insulating layer 120 is formed on the top surface of the semiconductor substrate 12.

The insulating layer 120 includes the insulating film 16, the insulating sheet 20 and the hollow part 15. The insulating sheet 20 is pasted using a semiconductor film laminator. Note that the insulating sheet 20 can be formed so as to span the groove without filling the groove with a resist. An adhesive layer is provided between the insulating film 16 and the insulating sheet 20 to glue the insulating sheet 20. In the present embodiment, the insulating sheet 20 is a dry film 30. Note that a polyimide film or a film made of acrylic resin or epoxy resin having high insulating properties, high humidity resistance and high strength is used for the dry film 30. The thickness of the dry film 30 is preferably 1 to 10 microns.

Figure 3:
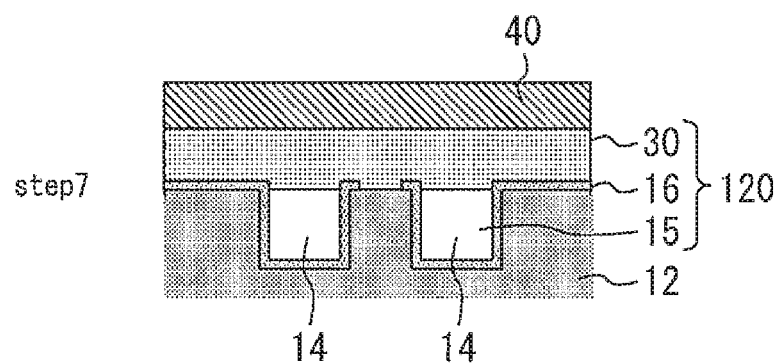
FIG. 3 is a cross-sectional view illustrating a photoresist applied onto FIG. 2 according to the first embodiment of the present invention.

Next, an opening is provided in the dry film 30 at the top of the opening provided in the insulating film 16 using the following procedure. First, as shown in FIG. 3, a photoresist 40 is applied to a top surface of the dry film 30 (step 7).

Figure 4:
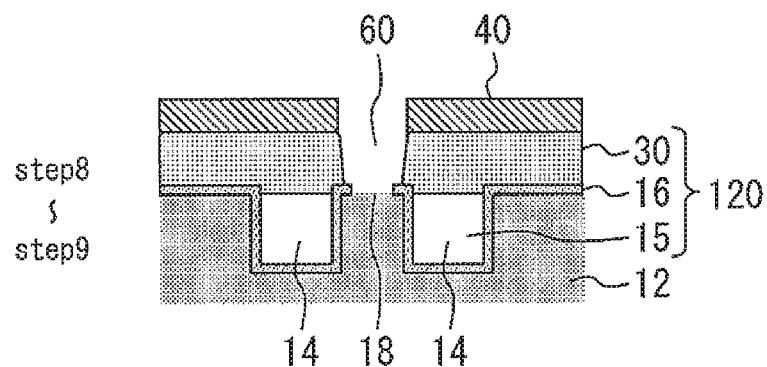
FIG. 4 is a cross-sectional view illustrating an opening provided in FIG. 3 according to the first embodiment of the present invention.

Next, a structure shown in FIG. 4 is formed. First, the photoresist 40 is patterned by lithography (step 8). Next, the dry film 30 is etched using the patterned photoresist 40 as an etching mask (step 9). As a result, an opening is formed in the dry film 30.

Figure 5:
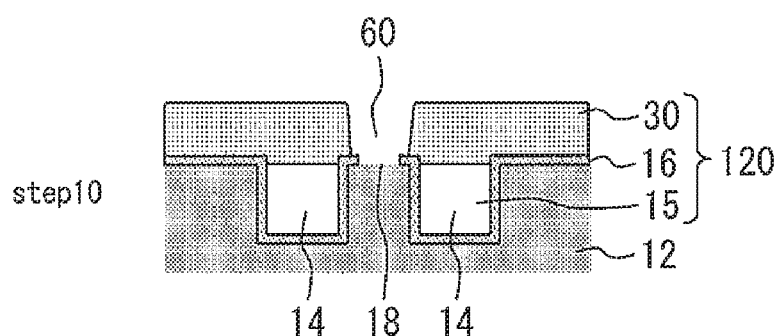
FIG. 5 is a cross-sectional view equivalent to FIG. 4 from which the photoresist is removed according to the first embodiment of the present invention.

Next, as shown in FIG. 5, the photoresist 40 is removed (step 10). Therefore, a first opening 60 is formed in the insulating layer 120 in steps 2 to 5 and steps 7 to 10 so that the part corresponding to an electrode 18 is exposed. In the present embodiment, steps 2 to 5 and steps 7 to 10 constitute a step of forming an opening.

Figure 6:
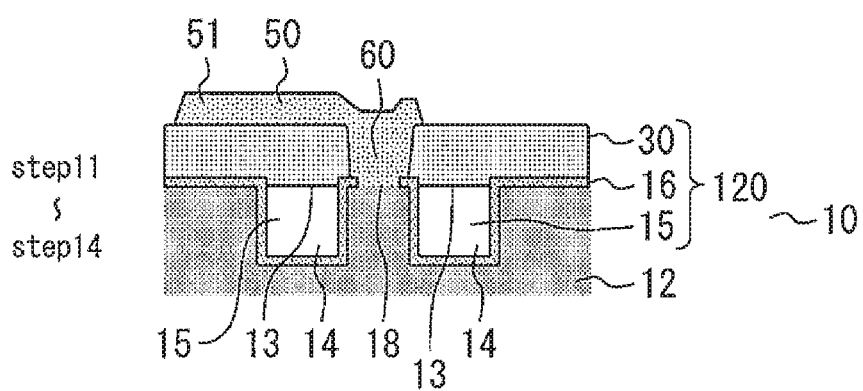
FIG. 6 is a cross-sectional view equivalent to FIG. 5 provided with an electrode according to the first embodiment of the present invention.

Next, as shown in FIG. 6, an electrode 50 is formed on a top surface of the insulating layer 120 so as to fill the first opening 60. The electrode 50 is formed according to the following lift-off process. First, a resist is applied to the top surface of the insulating layer 120 (step 11). Next, the resist is patterned by lithography (step 12). Next, a metal layer 51 is formed on the insulating layer 120 and a surface of the patterned resist (step 13). At this time, the metal layer 51 is formed so as to fill the first opening 60. Next, the resist is removed (step 14). As a result, the metal layer 51 on the resist is removed and the electrode 50 is formed. The electrode 50 is formed of a material such as gold, nickel, titanium, platinum, molybdenum, gold alloy or a multilayer film thereof.

Another method for wiring the electrode on a semiconductor laser provided with a grooved semiconductor substrate can be a method whereby the groove is once filled with a resist. In this method, the groove is filled with the resist to make the surface flat first. Next, an electrode is formed on the top surface of the resist. Then, the resist is removed. Since the groove is filled with the resist according to this method, the number of manufacturing steps increases and the manufacturing process becomes complicated. In contrast, in the semiconductor laser 10 obtained in the present embodiment, the electrode 50 is formed on the top surface of the insulating layer 120. For this reason, the step of filling the groove 14 with the resist and the step of removing the resist become unnecessary. Therefore, the manufacturing process is simplified.

Furthermore, as shown in FIG. 6, in the semiconductor laser 10 obtained in the present embodiment, the dry film 30 is provided below the undersurface of the electrode 50 above the opening 13 of the groove 14. For this reason, the electrode 50 is reinforced by the dry film 30. In contrast, in the semiconductor laser obtained by the above-described method that fills the groove with the resist, the electrode exists by itself at the opening of the groove. Therefore, in the present embodiment, it is possible to improve the strength of the electrode 50 compared to the method whereby the groove is filled with the resist once.

Furthermore, another method for wiring the electrode for the semiconductor laser provided with a grooved semiconductor substrate can be a method that forms an electrode along a groove. In this method, the electrode is wired by passing along a side face and a bottom face of the groove. Therefore, the shape of the electrode changes depending on the structure of the groove. For this reason, the manufacturing process becomes complicated. Moreover, this may result in a process defect in which the electrode is discontinued at a difference in level of the groove. In contrast, in the present embodiment, the electrode 50 is formed on the flat top surface of the insulating layer 120. Therefore, compared to the method that forms the electrode along the groove, the electrode 50 can be formed easily and reliably.

Furthermore, in the semiconductor laser 10 obtained in the present embodiment, the semiconductor substrate 12 is insulated from the electrode 50 by the insulating layer 120. Here, when an insulating distance between the semiconductor substrate and the electrode is small, an element capacitance of the semiconductor laser is large. When the element capacitance is large, a delay time thereof is large. This may be a detriment to a high speed operation of the semiconductor laser. Here, the insulating layer 120 includes the insulating film 16, the dry film 30 and the hollow part 15. In contrast, in the semiconductor laser obtained using the method that fills the groove with the resist once, the insulating layer is constructed of the insulating film and the hollow part. In addition, in the semiconductor laser obtained using the method that forms the electrode along the groove, the insulating layer is constructed of an insulating film. Therefore, the insulating distance is long in the present embodiment compared to these methods. Thus, it is possible to reduce the element capacitance. Therefore, in the present embodiment, it is possible to achieve high speed operation required for a communication laser.

As a modification of the present embodiment, the electrode 50 may be formed using a method shown below. First, after executing steps 1 to 10, a metal layer is formed so as to fill the first opening 60 (step 111). Next, a resist is applied to the surface of the metal layer (step 112). Next, the resist is patterned by lithography (step 113). Next, the metal layer is etched using the patterned mask as an etching mask (step 114). As a result, the electrode 50 is formed.

Furthermore, in the present embodiment, the steps of providing an opening in the insulating film 16 (steps 2 to 5) and the steps of providing an opening in the dry film 30 (steps 7 to 10) are divided as different steps. In contrast, without executing steps 2 to 5, an opening may be provided in the insulating film 16 as well in steps 7 to 10.

Second Embodiment

Figure 7:
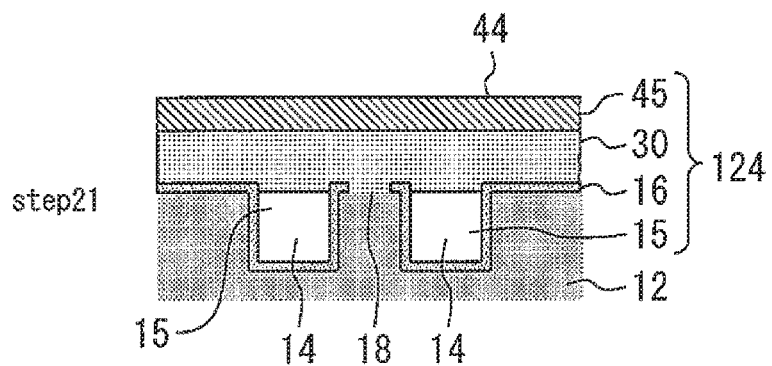
FIG. 7 is a cross-sectional view equivalent to FIG. 2 on which a hard mask is formed according to a second embodiment of the present invention.
Figure 8:
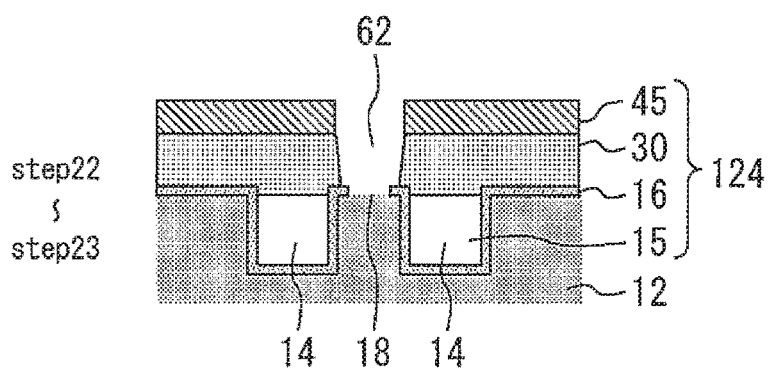
FIG. 8 is a cross-sectional view equivalent to FIG. 7 provided with an opening according to the second embodiment of the present invention.
Figure 9:
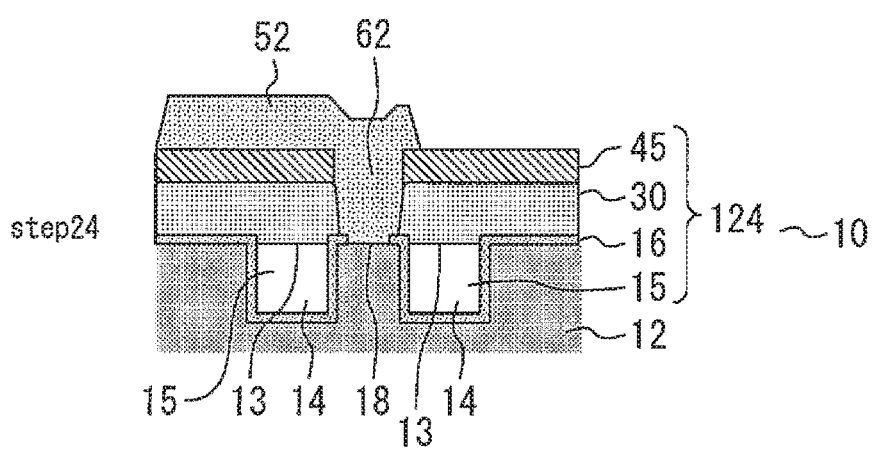
FIG. 9 is a cross-sectional view equivalent to FIG. 8 provided with an electrode according to the second embodiment of the present invention.

FIG. 7 to FIG. 9 are cross-sectional views illustrating a method for manufacturing the semiconductor laser 10 according to a second embodiment. In the present embodiment, steps 1 to 6 shown in the first embodiment are executed first. Next, as shown in FIG. 7, a hard mask 45 is formed on the top surface of the dry film 30 (step 21). In the present embodiment, the hard mask 45 is a silicon oxide film 44. In the present embodiment, an insulating layer 124 is provided with the insulating film 16, the dry film 30, the hollow part 15 and the hard mask 45.

Next, an opening is provided in the dry film 30 and the hard mask 45 using the following procedure. First, the hard mask 45 is patterned by etching (step 22). Next, the dry film 30 is etched using the patterned hard mask 45 as an etching mask (step 23). As a result, an opening is formed in the dry film 30 and the hard mask 45 as shown in FIG. 8. Thus, a first opening 62 is formed in the insulating layer 124 so that the part corresponding to an electrode 18 is exposed. In the present embodiment, steps 22 and 23 constitute a step of forming an opening.

Next, as shown in FIG. 9, an electrode 52 is formed so as to fill the first opening 62 on the top surface of the insulating layer 124 (step 24). The electrode 52 is formed using the same method as that shown in the first embodiment. Note that in the present embodiment, a silicon oxide film 44 is used as the hard mask 45, but a silicon-based insulating film such as silicon nitride film or silicon oxynitride film or aluminum oxide may also be used. In the present embodiment, the dry film 30 is used as the insulating sheet 20, but a photosensitive permanent resist may also be used.

As shown in FIG. 9, in the semiconductor laser 10 obtained in the present embodiment, the hard mask 45 remains on the top surface of the dry film 30. Therefore, the dry film 30 and the hard mask 45 are provided below the undersurface of the electrode 52 above the opening 13 of the groove 14. For this reason, the electrode 52 is reinforced by the dry film 30 and the hard mask 45. Therefore, compared with the first embodiment, it is possible to further improve the strength of the electrode 52. The insulating layer 124 in the semiconductor laser 10 obtained in the present embodiment is provided with the insulating film 16, the dry film 30, the hollow part 15 and the hard mask 45. Thus, the insulating distance between the electrode 52 and the semiconductor substrate 12 is larger than that in the first embodiment. Therefore, the element capacitance can be further reduced compared to the first embodiment. Thus, it is possible to achieve high speed operation of the semiconductor laser 10.

Third Embodiment

Figure 10:
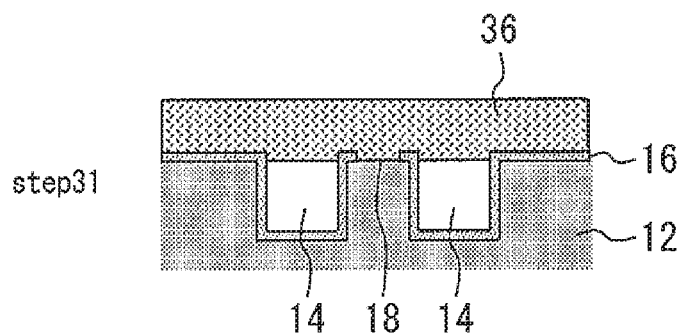
FIG. 10 is a cross-sectional view equivalent to FIG. 1 on which a permanent resist is provided according to a third embodiment of the present invention.
Figure 11:
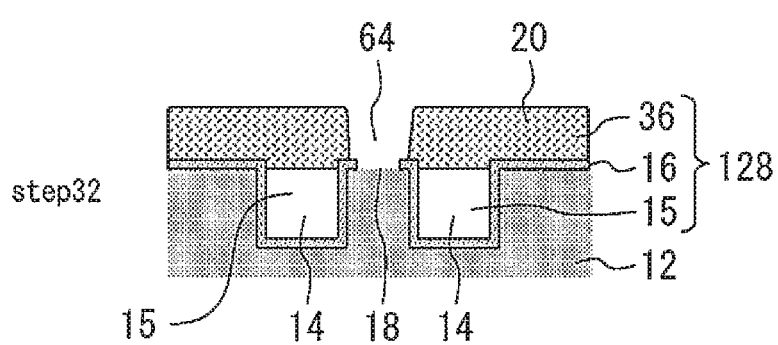
FIG. 11 is a cross-sectional view equivalent to FIG. 10 provided with an opening according to the third embodiment of the present invention.

FIG. 10 and FIG. 11 are cross-sectional views illustrating a method for manufacturing the semiconductor laser 10 according to the present embodiment. In the present embodiment, steps 1 to 5 shown in the first embodiment are executed first. Next, as shown in FIG. 10, a photosensitive permanent resist 36 is pasted to the top surface of the insulating film 16 (step 31). For example, TMMF (registered trademark) S2000 (trade name) manufactured by TOKYO OHKA KOGYO CO., LTD. is used for the permanent resist 36. The method for pasting the permanent resist 36 is similar to that described in the first embodiment.

Next, an opening is provided in the permanent resist 36. The opening is provided by patterning the permanent resist 36 by lithography (step 32). As a result, a first opening 64 is provided in an insulating layer 128 as shown in FIG. 11. In the present embodiment, step 32 is a step of forming an opening. The insulating layer 128 is provided with the insulating film 16, the hollow part 15 and the patterned permanent resist 36. After that, an electrode is formed on the top surface of the insulating layer 128 using a method similar to that of the first embodiment (step 33).

In the present embodiment, the permanent resist 36 is patterned by lithography and an opening is provided. For this reason, when providing an opening in the insulating sheet 20, the step of etching using a resist is unnecessary. Therefore, it is possible to simplify the manufacturing process compared to the first and second embodiments.

Fourth Embodiment

Figure 12:
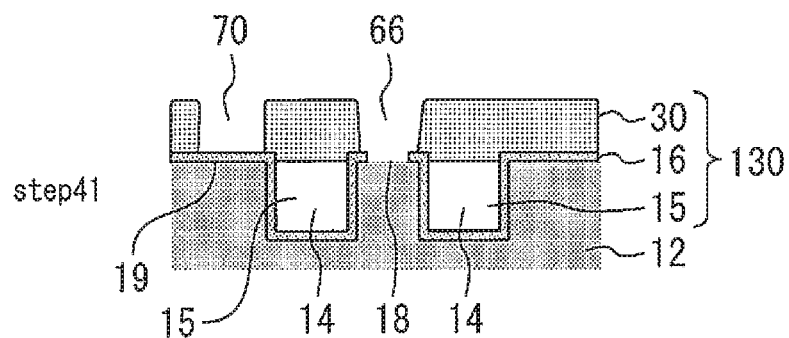
FIG. 12 is a cross-sectional view equivalent to FIG. 5 further provided with a second opening according to a fourth embodiment of the present invention.
Figure 13:
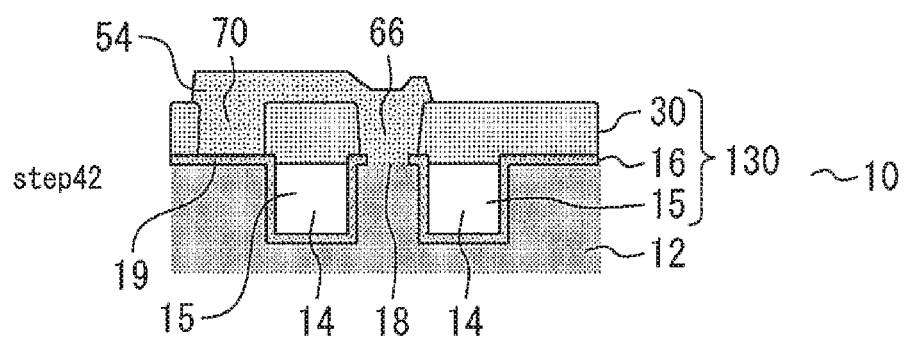
FIG. 13 is a cross-sectional view equivalent to FIG. 12 provided with an electrode according to the fourth embodiment of the present invention.

FIG. 12 and FIG. 13 are cross-sectional views illustrating a method for manufacturing the semiconductor laser 10 according to the present embodiment. In the present embodiment, steps 1 to 6 shown in the first embodiment are executed. Next, in steps similar to steps 7 to 10, in addition to a first opening 66, a second opening 70 is formed (step 41). As shown in FIG. 12, the second opening 70 is provided in a part corresponding to bonding 19 of the semiconductor substrate 12 in so that the insulating film 16 is exposed. In the present embodiment, step 41 is a step of forming an opening. An insulating layer 130 is provided with the insulating film 16, the hollow part 15 and the dry film 30.

Next, as shown in FIG. 13, an electrode 54 is formed on a top surface of the insulating layer 130 so as to fill the first opening 66 and the second opening 70 (step 42). The electrode 54 is formed using a method similar to that shown in the first embodiment.

Figure 14:
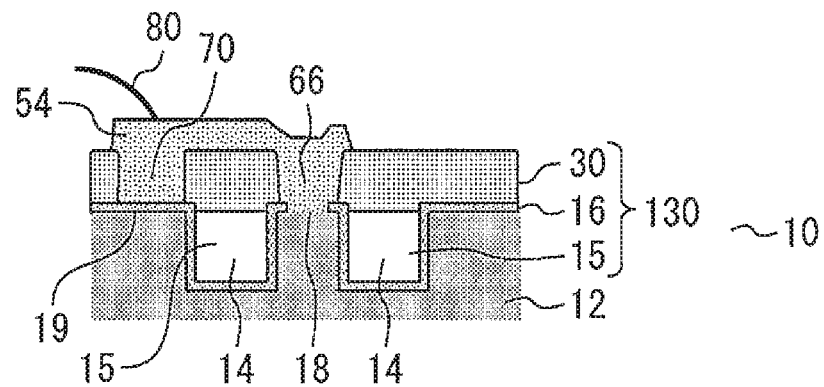
FIG. 14 is a cross-sectional view equivalent to FIG. 13 provided with a bonding wire according to the fourth embodiment of the present invention.

FIG. 14 is a cross-sectional view illustrating bonding applied to the semiconductor laser 10 according to the present embodiment. A bonding wire 80 is connected to the electrode 54 above a part corresponding to bonding 19. In the semiconductor laser 10 obtained in the present embodiment, the second opening 70 is provided in the dry film 30 on the part corresponding to bonding 19. Therefore, stress caused by bonding is prevented from transmitting to the dry film 30. Thus, it is possible to prevent peeling of the dry film 30 due to stress.

Note that in the present embodiment, in addition to the first opening 66, the second opening 70 is formed in step 41. However, the second opening 70 may be formed in a step different from that of the first opening 66. Furthermore, in the present embodiment, the second opening 70 is added to the structure shown in the first embodiment. However, the second opening 70 may also be added to the structure shown in the second or third embodiment.

According to the method for manufacturing a semiconductor laser of the present invention, the insulating sheet is pasted so as to cover the opening of the groove provided in the semiconductor substrate. As a result, an insulating layer is formed on the semiconductor substrate. The electrode is provided on the top surface of the insulating layer. This eliminates the need for a step of filling the groove with the resist. The manufacturing process can therefore be simplified.

In the semiconductor laser according to the present invention, the insulating sheet is disposed on the undersurface of the electrode at the opening of the groove. When forming an electrode, this structure allows the electrode to be formed on the top surface of the insulating sheet. The insulating sheet can be formed by causing the insulating sheet to span the groove without the need to fill the groove with the resist. This eliminates the need for a step of filling the groove with the resist. The manufacturing process can therefore be simplified. Furthermore, the electrode can be reinforced by a dry film at the opening of the groove. This improves the strength of the electrode.

Obviously many modifications and variations of the present invention are possible in the light of the above teachings.

It is therefore to be understood that within the scope of the appended claims the invention may be practiced otherwise than as specifically described.

The invention claimed is:

1. A method for manufacturing a semiconductor laser comprising:
   a step of forming an insulating film on a surface of a grooved semiconductor substrate;
   a step of pasting an insulating sheet to a top surface of the insulating film so as to cover at least part of an opening of the groove and forming an insulating layer on the semiconductor substrate;
   a step of forming an opening of providing a first opening in the insulating layer so that a part corresponding to an electrode of the semiconductor substrate is exposed; and
   a step of forming the electrode on a top surface of the insulating layer so as to fill the first opening.

2. The method for manufacturing a semiconductor laser according to claim 1,
   wherein the insulating sheet is a dry film, and
   the step of forming the opening comprises:
   a step of applying a photoresist to the top surface of the insulating sheet;
   a step of patterning the photoresist by lithography; and
   a step of etching the dry film using the patterned photoresist as an etching mask.

3. The method for manufacturing a semiconductor laser according to claim 1,
   wherein the insulating sheet is a permanent resist, and
   the step of forming the opening comprises a step of patterning the permanent resist by lithography.

4. The method for manufacturing a semiconductor laser according to claim 1,
   wherein the step of forming the insulating layer comprises a step of forming a hard mask on the top surface of the insulating sheet, and
   the step of forming the opening comprises:
   a step of patterning the hard mask by etching, and
   a step of etching the insulating sheet using the patterned hard mask as an etching mask.

5. The method for manufacturing a semiconductor laser according to claim 4, wherein the insulating sheet is a dry film.

6. The method for manufacturing a semiconductor laser according to claim 1,
   wherein the step of forming the electrode on the top surface of the insulating layer comprises:
   a step of applying a resist to the top surface of the insulating layer;
   a step of patterning the resist by lithography;
   a step of forming a metal layer on the insulating layer and the top surface of the patterned resist so as to fill the first opening; and
   a step of removing the metal layer on the resist by removing the resist and forming the electrode.

7. The method for manufacturing a semiconductor laser according to claim 1,
   wherein the step of forming the electrode on the top surface of the insulating layer comprises:
   a step of forming a metal layer on the top surface of the insulating layer so as to fill the first opening;
   a step of applying a resist to the surface of the metal layer;
   a step of patterning the resist by lithography; and
   a step of forming the electrode by etching the metal layer using the patterned resist as an etching mask.

8. The method for manufacturing a semiconductor laser according to claim 1,
   wherein the step of forming the opening comprises a step of providing a second opening in a part corresponding to bonding of the semiconductor substrate so that the insulating film is exposed, and
   the electrode is formed so as to fill the second opening as well as the first opening.

9. A semiconductor laser comprising:
   a grooved semiconductor substrate;
   an insulating layer formed on the semiconductor substrate;
   a first opening provided in the insulating layer so that a part corresponding to an electrode of the semiconductor substrate is exposed; and
   the electrode formed on a top surface of the insulating layer so as to fill the first opening, and
   the insulating layer comprises:
   an insulating film formed on a surface of the semiconductor substrate;
   an insulating sheet provided on the insulating film so as to cover at least part of an opening of the groove; and
   a hollow part surrounded by the groove and the insulating sheet.

10. The semiconductor laser according to claim 9, wherein the insulating sheet is a dry film.

11. The semiconductor laser according to claim 9, wherein the insulating sheet is a permanent resist.

12. The semiconductor laser according to claim 9, wherein the insulating layer further comprises a hard mask formed on the top surface of the insulating sheet.

13. The semiconductor laser according to claim 9,
   wherein a second opening is provided in a part corresponding to bonding of the semiconductor substrate so that the insulating film is exposed, and
   the electrode is formed so as to fill the second opening as well as the first opening.

* * * * *